United States Patent
Nagatani et al.

(10) Patent No.: US 6,716,718 B2
(45) Date of Patent: Apr. 6, 2004

(54) METHOD OF PRODUCING A SEMICONDUCTOR DEVICE

(75) Inventors: Hiroyuki Nagatani, Hyogo (JP); Kouji Taniguchi, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 117 days.

(21) Appl. No.: 09/972,147

(22) Filed: Oct. 9, 2001

(65) Prior Publication Data

US 2002/0086496 A1 Jul. 4, 2002

(30) Foreign Application Priority Data

Jan. 4, 2001 (JP) .......................................... 2001-000161

(51) Int. Cl.⁷ .............................................. H01L 21/76
(52) U.S. Cl. ..................... 438/424; 438/435; 438/437; 438/739
(58) Field of Search ................................ 438/424, 435, 438/437, 739

(56) References Cited

U.S. PATENT DOCUMENTS

| | | | | |
|---|---|---|---|---|
| 5,578,518 A | * | 11/1996 | Koike et al. ................ | 438/424 |
| 5,712,185 A | * | 1/1998 | Tsai et al. ................... | 438/424 |
| 5,766,823 A | * | 6/1998 | Fumitomo .................. | 430/314 |
| 6,121,113 A | * | 9/2000 | Tajatsuka et al. ........... | 438/424 |
| 6,187,651 B1 | * | 2/2001 | Oh .............................. | 438/435 |
| 6,277,710 B1 | * | 8/2001 | Kim et al. ................... | 438/431 |
| 6,333,232 B1 | * | 12/2001 | Kunikiyo .................... | 438/296 |
| 6,333,242 B1 | * | 12/2001 | Hwang et al. .............. | 438/435 |
| 6,355,538 B1 | * | 3/2002 | Tseng .......................... | 438/424 |
| 6,372,602 B1 | * | 4/2002 | Mitsuiki ..................... | 438/424 |
| 6,372,604 B1 | * | 4/2002 | Sakai et al. ................. | 438/425 |
| 2002/0072197 A1 | * | 6/2002 | Kang et al. ................. | 438/424 |
| 2002/0151143 A1 | * | 10/2002 | Shiozawa et al. .......... | 438/296 |
| 2003/0027404 A1 | * | 2/2003 | Lai et al. .................... | 438/424 |

FOREIGN PATENT DOCUMENTS

| | | |
|---|---|---|
| JP | 11-230385 | 8/1999 |
| JP | 11-287090 | 10/1999 |
| JP | 2000-124303 | 4/2000 |
| JP | 2000-269322 | 9/2000 |

* cited by examiner

*Primary Examiner*—Amir Zarabian
*Assistant Examiner*—Toniae M. Thomas
(74) *Attorney, Agent, or Firm*—McDermott, Will & Emery

(57) ABSTRACT

A trench is formed by performing an anisotropic etching treatment on a silicon substrate with the use of a mask pattern including a pad oxide film, a polysilicon film, and a silicon nitride film formed on the silicon substrate, as a mask. Next, the side surface of the polysilicon film is retreated by etching so that the part of an oxide film formed on the side surface of the polysilicon film may not be hung over the part of an oxide film formed on the side surface of the pad oxide film. Next, an oxide film is formed by performing a thermal oxidation treatment on the inner wall surface of the trench including the exposed side surface of the polysilicon film. This produces a semiconductor device that prevents voids from being formed in a trench isolation structure.

10 Claims, 11 Drawing Sheets

METHOD OF PRODUCING A SEMICONDUCTOR DEVICE

BACKGROUND OF THE INVENTION

1. Field of the Invention

The present invention relates to a method of producing a semiconductor device, and more particularly to a method of producing a semiconductor device for forming a trench isolation structure.

2. Description of the Background Art

Trench isolation is known as one of the isolation structures in semiconductor devices. In order to form a bird's beak in the trench isolation, an inner wall oxidation process for oxidizing an exposed inner wall of the trench is carried out after the trench is formed.

Hereafter, one example of such a method of producing a semiconductor device for forming a trench isolation structure according to a prior art will be described. First, referring to FIG. 18, a pad oxide film made of a silicon oxide film is formed on a silicon substrate 101. A polysilicon film is formed on the pad oxide film. A silicon nitride film is formed on the polysilicon film. A photoresist pattern (not illustrated) is formed on the silicon nitride film.

With the use of the photoresist pattern as a mask, an anisotropic etching treatment is carried out on the silicon nitride film, the polysilicon film, and the pad oxide film to expose a surface of the silicon substrate 101, thereby forming a mask pattern including a silicon nitride film 104a, a polysilicon film 103a, and a pad oxide film 102a for forming a trench. With the use of the mask pattern as a mask, an anisotropic etching treatment is carried out on the silicon substrate 101 to form a trench 106.

Subsequently, referring to FIG. 19, a thermal treatment (inner wall oxidation process) is carried out to form an oxide film 107 on the exposed surface of the trench 106, on the side surface of the pad oxide film, and on the side surface of the polysilicon film 103a.

Next, referring to FIG. 20, a silicon oxide film 108 is formed to fill the trench 106. Thereafter, a chemical mechanical polishing treatment is carried out to polish the surface of the silicon oxide film 108. Next, referring to FIG. 21, a wet etching treatment is carried out on the silicon oxide film 108 to expose the silicon nitride film 104a almost completely.

Thereafter, the exposed silicon nitride film 104a is removed, and further the polysilicon film 103a and the pad oxide film 102a are successively removed. Thus, referring to FIG. 22, a bird's beak is formed in the trench isolation oxide film 109.

Next, referring to FIG. 23, gate electrodes 113 are formed to cross over element forming regions 114 formed on the surface of the silicon substrate 101 by the trench isolation oxide film 109. Thereafter, a semiconductor device such as a dynamic random access memory (DRAM) is formed, for example, by forming memory cells or the like in the element forming regions 114.

However, the aforementioned conventional production method involves the following problem. As described above, the inner wall oxidation shown in FIG. 19 is carried out in a state in which the side surface of the polysilicon film 103a is generally flush (coplanar) with the side surfaces of the pad oxide film 102a and the trench 106, as shown in FIG. 18.

In the inner wall oxidation, the oxidation rate of the polysilicon film 103a is substantially at the same level as the oxidation rate of the silicon substrate 101 (the surface of the trench 106), while the oxidation rate of the pad oxide film 102a is smaller than the oxidation rate of the polysilicon film 103a. For this reason, an oxide film grows faster on the surface of the silicon substrate 101 and on the surface of the polysilicon film 103a than on the surface of the pad oxide film 102a, thereby forming an overhung configuration in which the part of the oxide film that has grown on the side surface of the polysilicon film 103a is hung over the oxide film that has grown on the side surface of the pad oxide film 102a.

As a result of this, referring to FIG. 19, a recess 120 is formed between the part that has grown on the surface of the silicon substrate 101 and the part that has grown on the surface of the polysilicon film 103a in the oxide film 107. When a buried oxide film 108 is buried in the trench 106 in the step shown in FIG. 20 in a state in which the recess 120 has been formed, the part of the recess 120 is not filled with the buried oxide film 108 and remains as voids 121.

Referring to FIG. 22, these voids 121 form recesses 122 in the trench isolation oxide film 109 after the silicon nitride film 104a, the polysilicon film 103a, and the pad oxide film 102a are successively removed. If an attempt is made to form gate electrodes 113 in a state in which such recesses 122 have been formed in the trench isolation oxide film 109, an electrically conductive material 116 existing in the recesses 122, which material is for forming the gate electrodes 113, cannot be removed in patterning the gate electrodes 113.

For this reason, referring to FIG. 23, adjacent gate electrodes may possibly be short-circuited with each other by the electrically conductive material 116 that is remaining in the recesses 122. As a result of this, a desired operation may not be achieved in the semiconductor device.

SUMMARY OF THE INVENTION

The present invention has been made in order to solve the aforementioned problem of the prior art, and an object thereof is to provide a method of producing a semiconductor device that prevents voids from being formed in the trench isolation structure.

A method of producing a semiconductor device according to the present invention includes the following steps. A first film having a dielectric property, a second film having an oxidation property different from that of the first film, and a layer serving as a mask material are successively formed on a semiconductor substrate. A mask pattern for forming a trench in the semiconductor substrate is formed by performing an etching treatment on the first film, the second film, and the layer serving as a mask material. A trench is formed by performing an etching treatment on the semiconductor substrate using the mask pattern as a mask. An etching treatment is performed so that a position of a side surface of the second film exposed on a side surface of the mask pattern will be retreated from a position of a side surface of the first film. An oxide film is formed on a surface of the first film and the trench including the retreated side surface of the second film by performing a thermal treatment. A buried dielectric film is formed on the oxide film so as to fill the trench. In the retreating step of retreating the position of the side surface of the second film from the position of the side surface of the first film, the side surface of the second film is retreated in advance so that the oxide film that has grown on the side surface of the second film may not be hung over the oxide film that has grown on the side surface of the first film after the thermal treatment step of forming the oxide film by thermal treatment is performed.

According to this production method, the side surface of the second film is retreated in advance for a predetermined length so that the oxide film that has grown on the side surface of the second film may not be hung over the oxide film that has grown on the side surface of the first film. Therefore, voids can be prevented from being formed when the buried oxide film is buried in the trench. This can prevent generation of etching residues in a trench isolation structure, which may occur in a conventional semiconductor device, e.g. in forming two gate electrodes extending in parallel so as to cross the trench isolation structure, thereby preventing the two gate electrodes from being electrically short-circuited.

Preferably, the second film is retreated by dry etching in the retreating step.

This can facilitate control of the retreated amount of the second film (the amount of etching) and provides a better uniformity of the retreated amount in a surface of the semiconductor substrate.

Preferably, the second film is retreated by wet etching in the retreating step. This can shorten the processing time.

Further, the retreating step is preferably performed before the step of forming the trench.

This can prevent etching of the inner wall part of the trench by retreating the side surface of the second film before forming the trench, thereby forming an isolation oxide film including an oxide film and a buried oxide film having a desired shape.

Furthermore, it is preferable that the first film, the second film, and the layer serving as a mask material specifically include a silicon oxide film, a polysilicon film, and a silicon nitride film, respectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
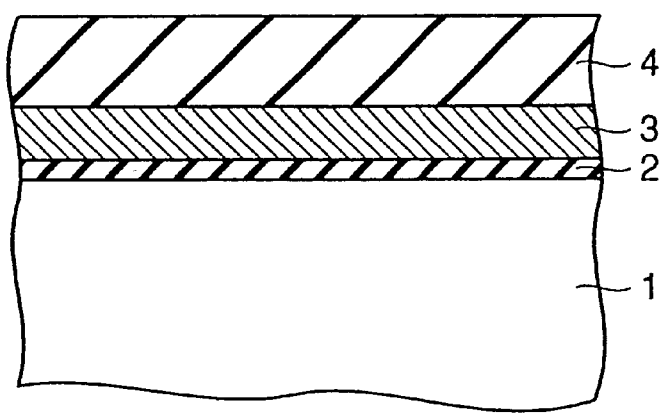
FIG. 1 is a cross-sectional view illustrating one step in a method of producing a semiconductor device according to a first embodiment of the present invention.

A method of producing a semiconductor device according to the first embodiment of the present invention will be described. First, referring to FIG. 1, a pad oxide film 2 made of a silicon oxide film is formed on a silicon substrate 1, for example, by the thermal oxidation method. A polysilicon film 3 is formed on the pad oxide film 2, for example, by the CVD method. A silicon nitride film 4 is formed on the polysilicon film 3, for example, by the CVD method.

Figure 2:
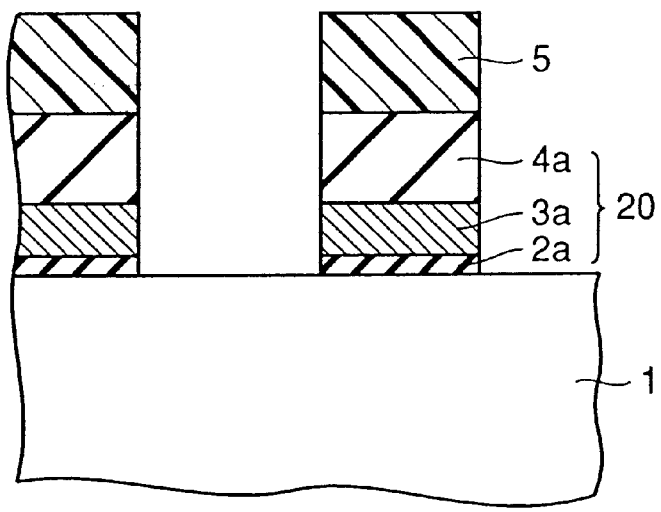
FIG. 2 is a cross-sectional view illustrating a step carried out after the step shown in FIG. 1 in the embodiment.

Next, referring to FIG. 2, a photoresist pattern 5 is formed on the silicon nitride film 4. With the use of the photoresist pattern 5 as a mask, an anisotropic etching treatment is carried out on the silicon nitride film 4, for example, under a pressure of about 700 mTorr and a RF power of about 200 W using a gas containing $CHF_3$, $CF_4$, Ar, and $O_2$.

Subsequently, with the use of the same gas, an anisotropic etching treatment is carried out on the polysilicon film 3 under a pressure of about 200 mTorr and a RF power of about 500 W. During this period, by this etching, the pad oxide film 2 located under the polysilicon film 3 is also etched to some extent. Thereafter, the photoresist pattern 5 is removed. This forms a mask pattern 20 made of a silicon nitride film 4a, a polysilicon film 3a, and a pad oxide film 2a for forming a trench in the silicon substrate 1.

Figure 3:
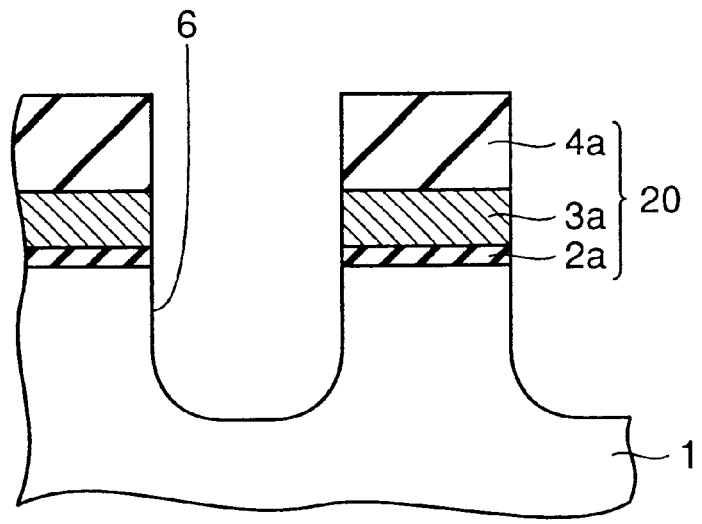
FIG. 3 is a cross-sectional view illustrating a step carried out after the step shown in FIG. 2 in the embodiment.

Next, referring to FIG. 3, with the use of the mask pattern 20 as a mask, an anisotropic etching treatment is carried out on the silicon substrate 1, for example, under a pressure of about 0.6 Pa and a RF power of about 80 W using a gas containing $Cl_2$ and $O_2$, so as to form a trench 6. Here, during this period, the pad oxide film 2 remaining on the silicon substrate 1 is also etched.

Figure 4:
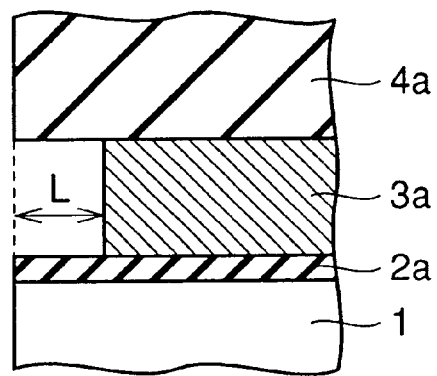
FIG. 4 is a cross-sectional view illustrating a step carried out after the step shown in FIG. 3 in the embodiment.

Next, referring to FIG. 4, an etching treatment (isotropic) is carried out on the side surface of the polysilicon film 3a exposed on the side surface of the mask pattern 20, for example, under a pressure of about 0.8 Pa and a RF power of about 60 W using a gas containing $Cl_2$ and $O_2$, so as to retreat the side surface for a predetermined length L (about 10 to 20 nm).

Figure 5:
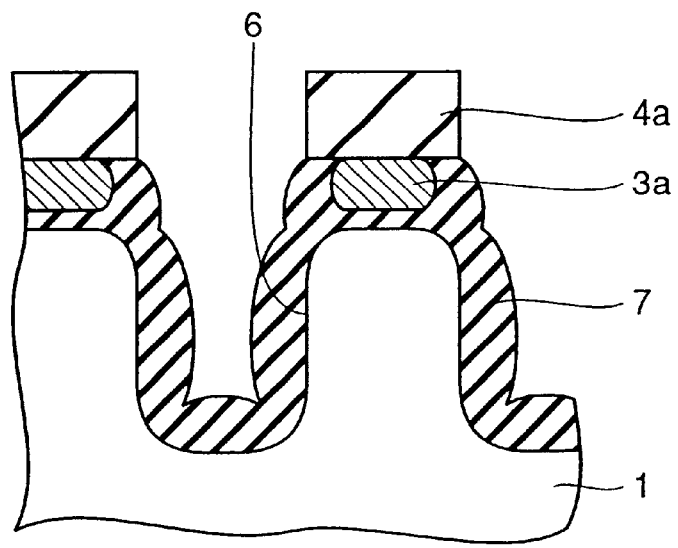
FIG. 5 is a cross-sectional view illustrating a step carried out after the step shown in FIG. 4 in the embodiment.
Figure 6:
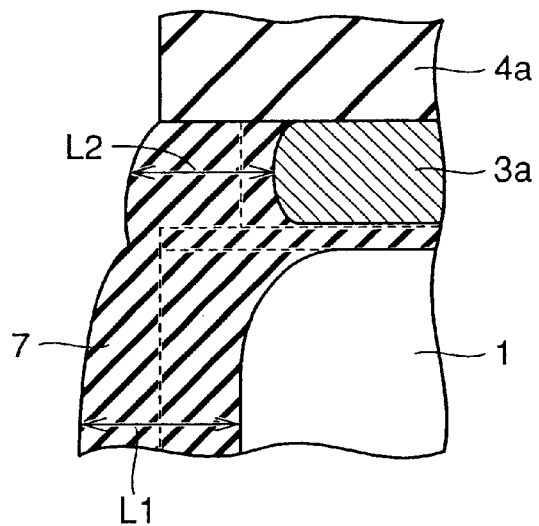
FIG. 6 is a partially enlarged cross-sectional view of the step shown in FIG. 5 in the embodiment.

Next, referring to FIG. 5, an oxidation process is carried out on the exposed inner surface of the trench 6 (inner wall oxidation process) in an oxygen atmosphere and at a temperature of about 1100° C. Referring to FIG. 6, the thickness L1 of the oxide film formed by this oxidation process on the part of the silicon substrate 1 forming the inner wall surface of the trench 6 is about 35 to 50 nm, while the thickness L2 of the oxide film formed on the side surface of the polysilicon film 3a is about 45 to 60 nm.

In this step, since the side surface of the polysilicon film 3a is retreated in advance for the predetermined length L, the part of the oxide film formed on the side surface of the polysilicon film 3a is not hung over the part of the oxide film formed on the side surface of the pad oxide film 2a. This prevents a recess from being formed at a part where the pad oxide film 2a is present in the oxide film 7.

Figure 7:
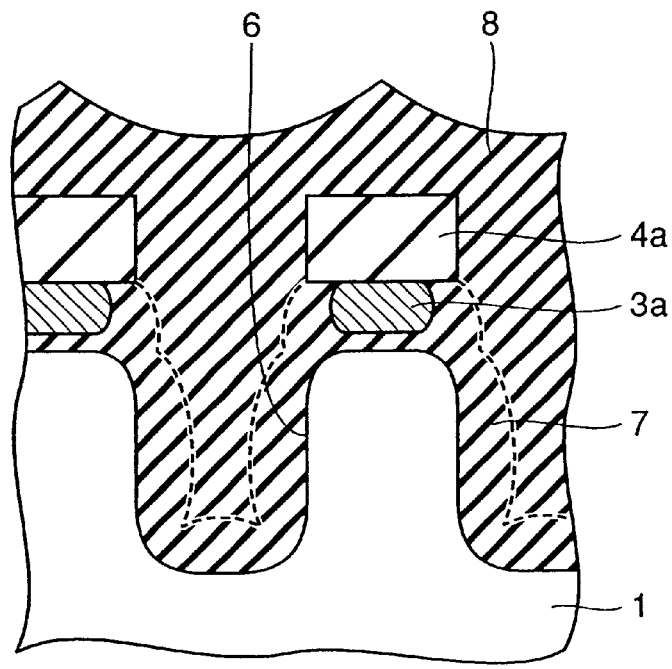
FIG. 7 is a cross-sectional view illustrating a step carried out after the step shown in FIG. 5 in the embodiment.
Figure 8:
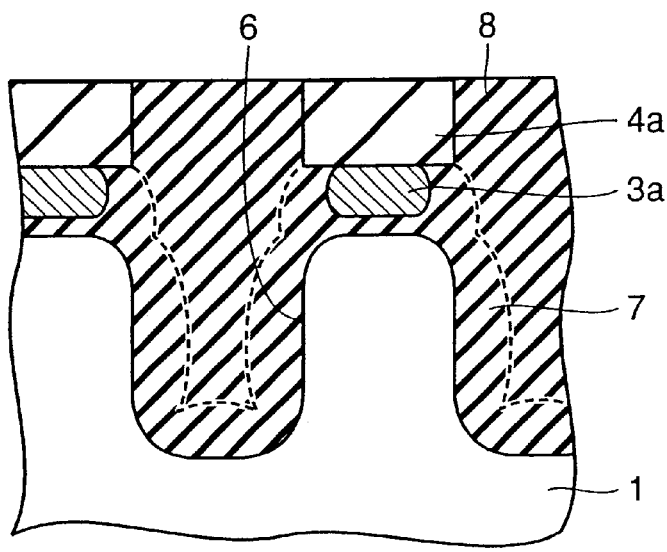
FIG. 8 is a cross-sectional view illustrating a step carried out after the step shown in FIG. 7 in the embodiment.

Next, referring to FIG. 7, an HDP oxide film 8 is formed by the high-density plasma method to fill the trench 6. Next, referring to FIG. 8, the HDP oxide film 8 is polished by the chemical mechanical polishing method. In this step, the polishing process is stopped at a stage in which the surface of the silicon nitride film 4a is exposed.

Figure 9:
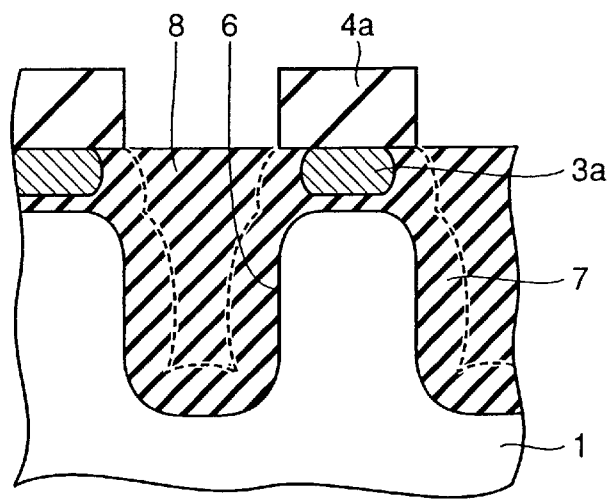
FIG. 9 is a cross-sectional view illustrating a step carried out after the step shown in FIG. 8 in the embodiment.
Figure 10:
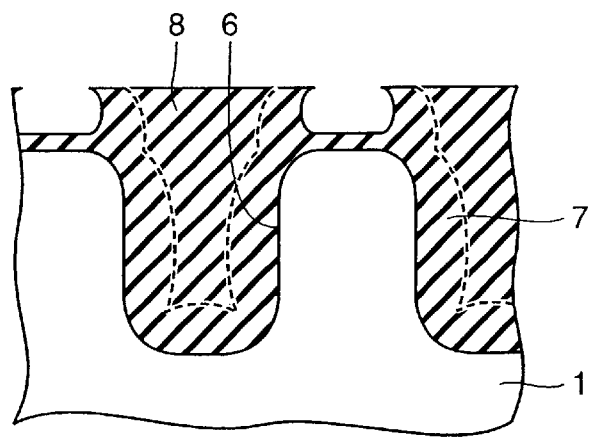
FIG. 10 is a cross-sectional view illustrating a step carried out after the step shown in FIG. 9 in the embodiment.

Next, referring to FIG. 9, the surface of the HDP oxide film 8 is retreated up to around the interface between the silicon nitride film 4a and the polysilicon film 3a by performing a wet etching treatment using HF or the like. Next, referring to FIG. 10, the silicon nitride film 4a is removed, and further the polysilicon film 3a is removed.

Figure 11:
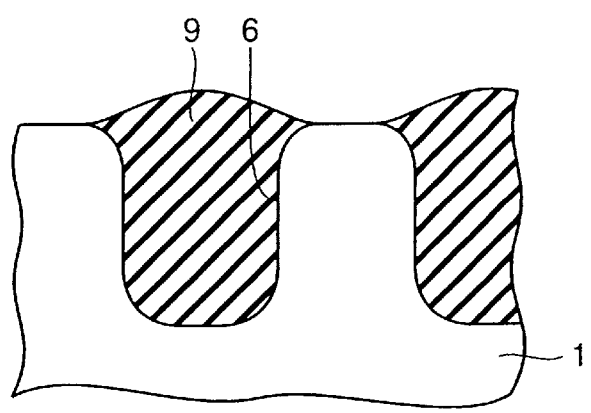
FIG. 11 is a cross-sectional view illustrating a step carried out after the step shown in FIG. 10 in the embodiment.

Thereafter, referring to FIG. 11, the pad oxide film 2a is removed by performing a wet etching treatment using HF or the like. This wet etching treatment simultaneously etches the HDP oxide film 8 that is located near the pad oxide film 2a, whereby a trench isolation oxide film 9 having a bird's beak is formed.

Figure 12:
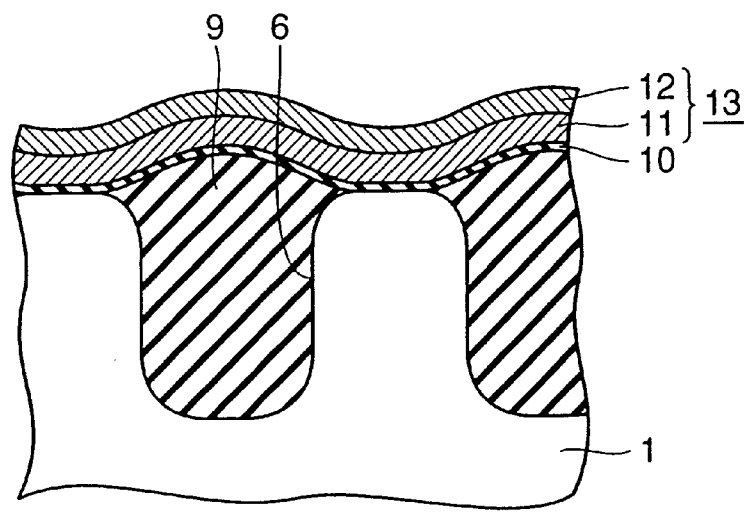
FIG. 12 is a cross-sectional view illustrating a step carried out after the step shown in FIG. 11 in the embodiment.
Figure 13:
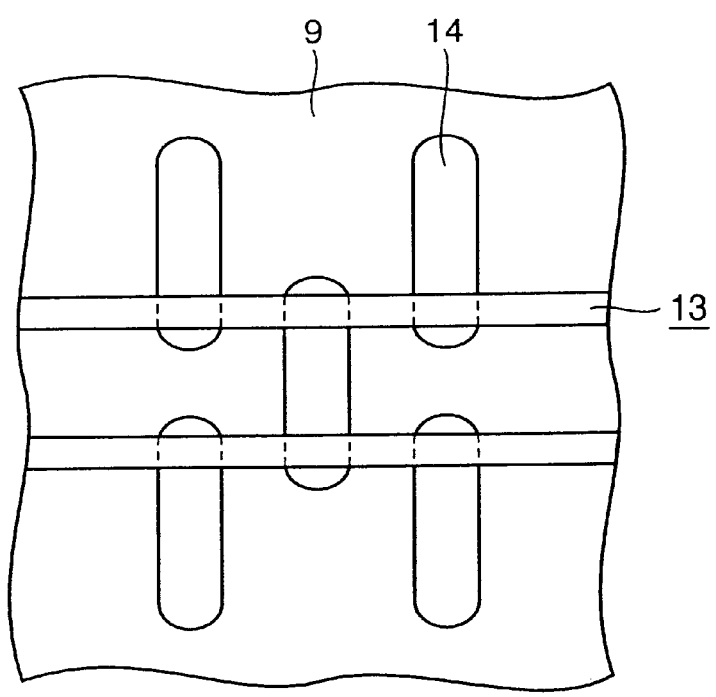
FIG. 13 is one plan view in the step shown in FIG. 12 in the embodiment.

Next, referring to FIG. 12, a gate electrode 13 including a polysilicon film 11 and a metal silicide film 12 such as tungsten silicide is formed on the silicon substrate 1 through the intermediary of a gate dielectric film 10. Referring to FIG. 13, this gate electrode 13 is formed to cross over an element forming region 14 surrounded by the trench isolation oxide film 9.

Thereafter, a memory cell or the like is formed in the element forming region 14, thereby completing, for example, a DRAM as a semiconductor device.

In the aforementioned method of producing a semiconductor device, the side surface of the polysilicon film 3a is retreated in advance for a predetermined length L before the oxidation process (inner wall oxidation process) is carried out. Therefore, the part of the oxide film formed on the side surface of the polysilicon film 3a is not hung over the part of the oxide film formed on the side surface of the pad oxide film 2a after the oxidation process. This can prevent a recess from being formed at a part where the pad oxide film 2a is present in the oxide film 7.

Figure 21:
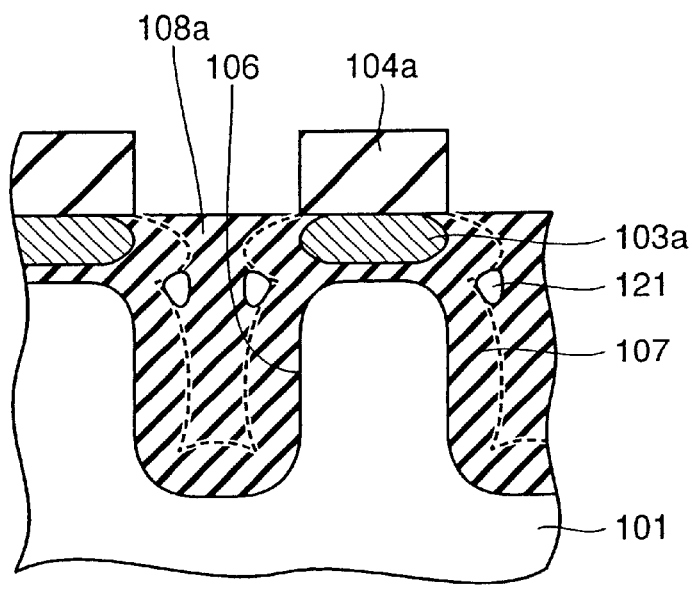
FIG. 21 is a cross-sectional view illustrating a step carried out after the step shown in FIG. 20.

Thus, compared with the conventional method of producing a semiconductor device, a recess is prevented from being formed at a part where the pad oxide film 2a is present in the oxide film 7, thereby preventing voids from being formed in filling the trench 6 with the HDP oxide film 8. Since the voids are not formed, a recess such as shown in FIG. 21 is prevented from being formed in the trench isolation oxide film 9 after the pad oxide film 2a is removed.

Since the recess is not formed, it is possible to avoid a situation in which a film made of an electrically conductive material for forming the gate electrode 13 remains without being removed in the neighborhood of the interface between the trench isolation oxide film 6 and the element forming region 14 in carrying out a patterning process for forming the gate electrode 13.

Figure 22:
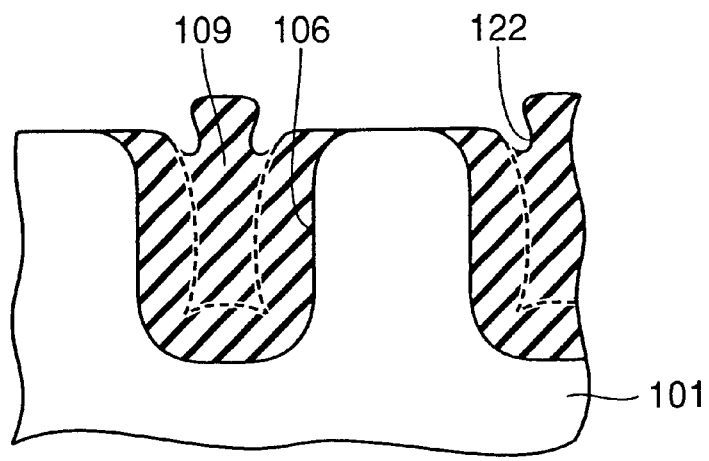
FIG. 22 is a cross-sectional view illustrating a step carried out after the step shown in FIG. 21.
Figure 23:
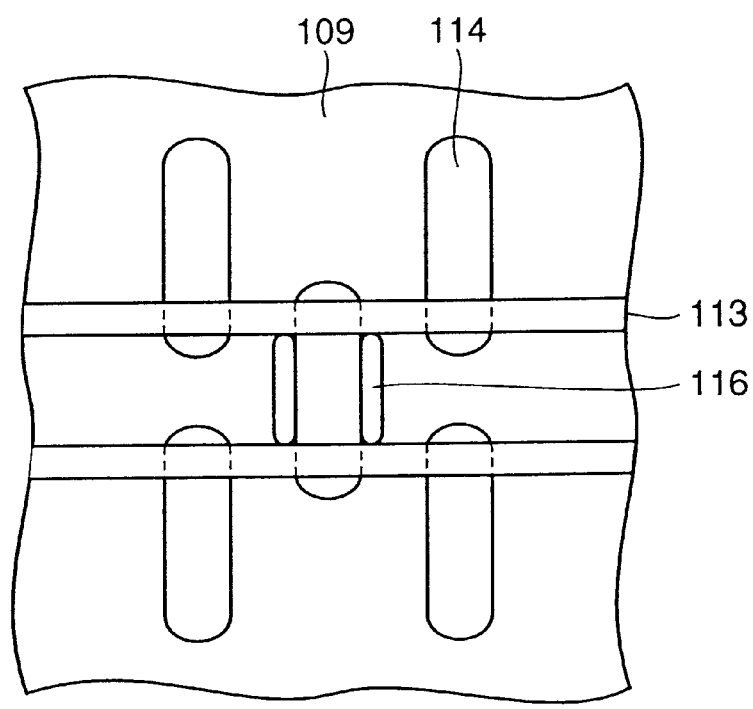
FIG. 23 is one plan view illustrating a step carried out after the step shown in FIG. 22.

As a result of this, adjacent gate electrodes are prevented from being electrically short-circuited via a film made of the remaining electrically conductive material such as shown in FIG. 22, whereby a desired operation of the semiconductor device is ensured. Particularly, in a DRAM or the like, numerous transistors are formed in a memory cell region, so that the gate electrodes of these transistors are prevented from being electrically short-circuited to other gate electrodes, whereby the DRAM or the like can be operated with certainty.

Further, since the side surface of the polysilicon film 3a is retreated for the predetermined length L by an isotropic dry etching treatment, the control of the retreated amount is facilitated, and a good uniformity of the retreated amount in the silicon wafer surface is provided.

Second Embodiment

A method of producing a semiconductor device according to the second embodiment of the present invention will be described. In the first embodiment, a case has been described in which the side surface of the polysilicon film 3a is retreated for the predetermined length L by isotropic dry etching. In this embodiment, a case will be described in which the retreating step is carried out by wet etching.

Figure 14:
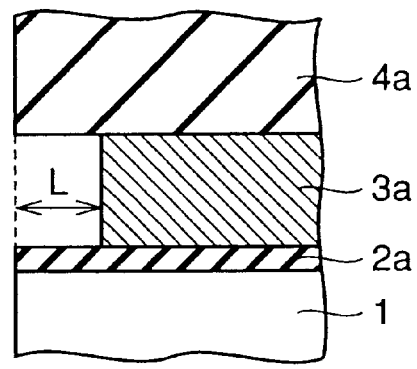
FIG. 14 is a cross-sectional view illustrating one step in a method of producing a semiconductor device according to a second embodiment of the present invention.

In other words, referring to FIG. 14, the side surface of the polysilicon film 3a is retreated for the length L by immersing the silicon wafer 1 into an $NH_4OH$ solution after the trench 6 shown in FIG. 3 is formed. Thereafter, steps similar to those shown in FIGS. 7 to 12 and described in the first embodiment are carried out to produce a semiconductor device having a trench isolation structure.

In the above-mentioned method of producing a semiconductor device, particularly the following effects are produced in addition to preventing adjacent gate electrodes from being electrically short-circuited to ensure a desired operation of the semiconductor device as described in the first embodiment.

Namely, by this method of producing a semiconductor device, the processing time can be shortened by carrying a wet etching treatment in retreating the side surface of the polysilicon film 3a.

Third Embodiment

Figure 15:
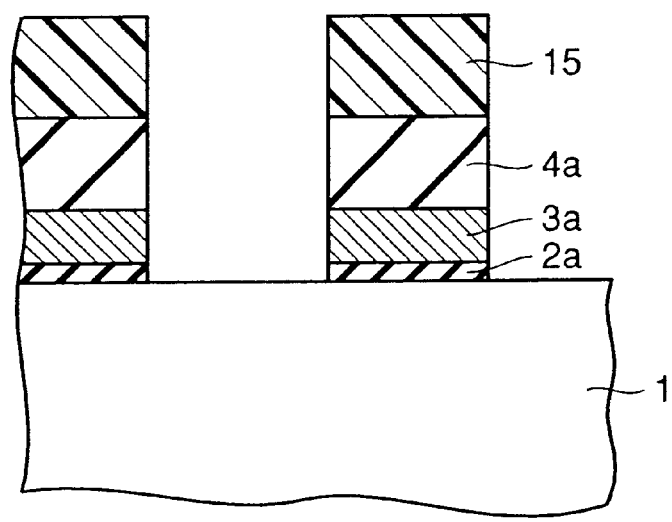
FIG. 15 is a cross-sectional view illustrating one step in a method of producing a semiconductor device according to a third embodiment of the present invention.

A method of producing a semiconductor device according to the third embodiment of the present invention will be described. First, a structure shown in FIG. 15 is obtained by carrying out steps similar to those shown in FIGS. 1 and 2 and described in the first embodiment.

Figure 16:
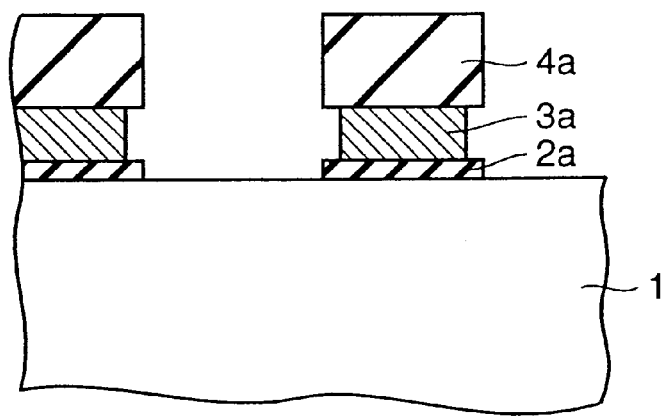
FIG. 16 is a cross-sectional view illustrating a step carried out after the step shown in FIG. 15 in the embodiment.

Next, referring to FIG. 16, a dry etching treatment or a wet etching treatment is carried out to retreat the side surface of the polysilicon film 3a for a predetermined length. In this step, if the dry etching treatment is to be carried out, it is preferable to carry out a step similar to the one shown in FIG. 4 and described in the first embodiment. On the other hand, if the wet etching treatment is to be carried out, it is preferable to carry out a step similar to the one shown in FIG. 13 and described in the second embodiment.

Figure 17:
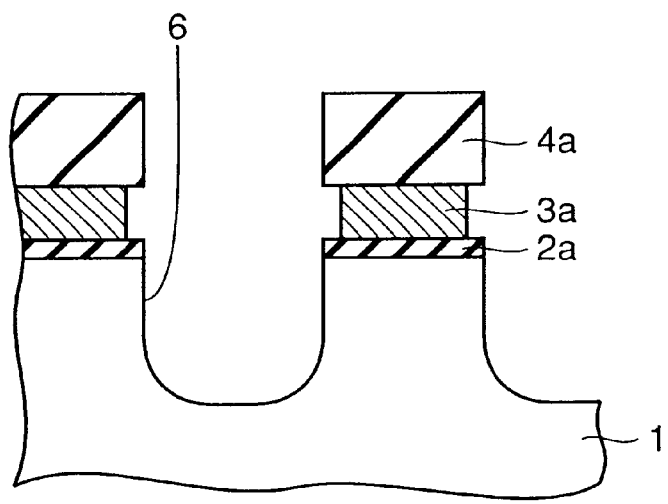
FIG. 17 is a cross-sectional view illustrating a step carried out after the step shown in FIG. 16 in the embodiment.
Figure 18:
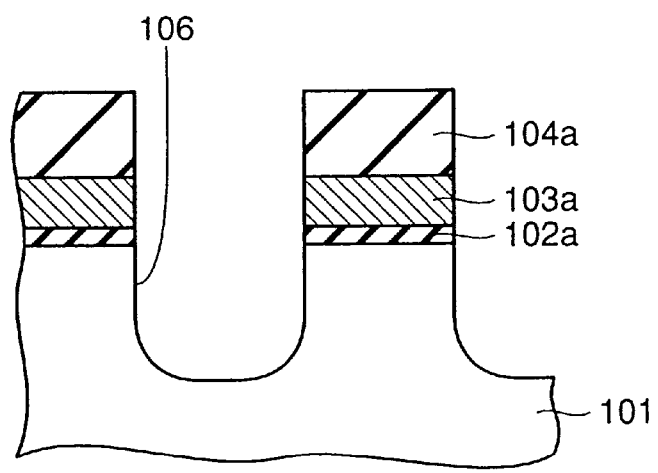
FIG. 18 is a cross-sectional view illustrating one step in a method of producing a semiconductor device according to a prior art.
Figure 19:
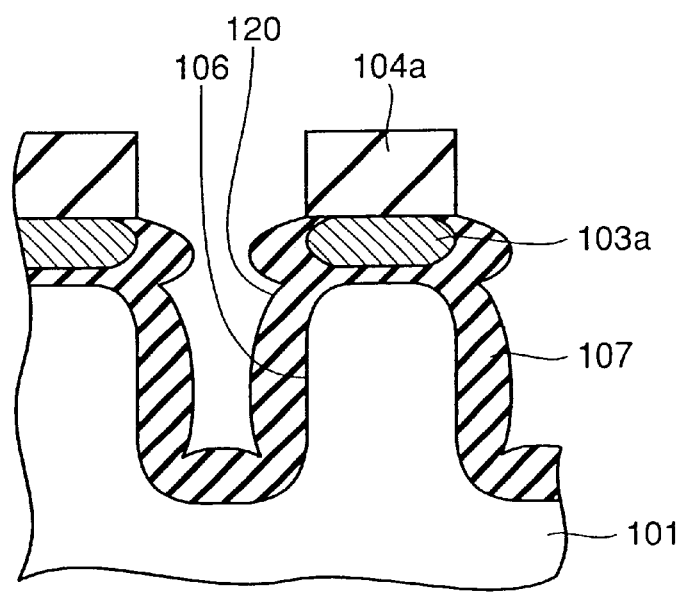
FIG. 19 is a cross-sectional view illustrating a step carried out after the step shown in FIG. 18.
Figure 20:
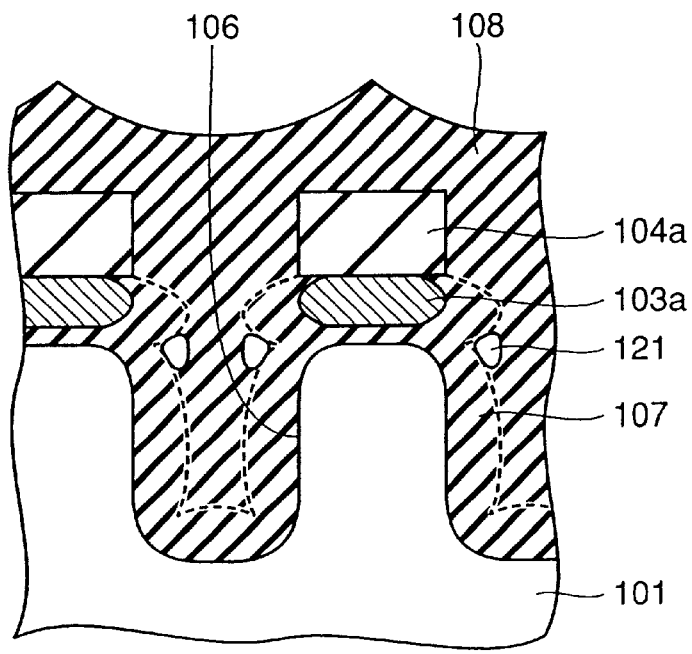
FIG. 20 is a cross-sectional view illustrating a step carried out after the step shown in FIG. 19.

Next, referring to FIG. 17, an anisotropic etching treatment is carried out on the silicon substrate 1 with the use of the silicon nitride film 4a and others as a mask, so as to form a trench 6. The condition for carrying out the anisotropic etching treatment is preferably a condition similar to the one described in the step shown in FIG. 3 in the first embodiment.

Thereafter, steps similar to those shown in FIGS. 7 to 12 and described in the first embodiment are carried out to produce a semiconductor device having a trench isolation structure.

In the above-mentioned method of producing a semiconductor device, particularly the following effects are produced in addition to preventing adjacent gate electrodes from being electrically short-circuited to ensure a desired operation of the semiconductor device as described in the first embodiment.

In this method of producing a semiconductor device, the trench 6 is formed in the silicon substrate 1 after the side surface of the polysilicon film 3a is retreated. If the side surface of the polysilicon film 3a is retreated after the trench 6 is formed, the inner wall part of the trench 6 (the part of the silicon substrate 1) is also etched to some extent during that time.

Therefore, by retreating the side surface of the polysilicon film 3a before forming the trench 6, such etching of the inner wall part of the trench 6 can be prevented, so that a trench isolation oxide film 9 having a desired shape can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a semiconductor device, the method comprising the steps of:

forming a first film having a dielectric property, a second film having an oxidation property different from that of said first film, and a layer serving as a mask material successively on a semiconductor substrate;

forming a mask pattern for forming a trench in said semiconductor substrate by performing an etching treatment on said first film, said second film, and said layer serving as a mask material;

forming a trench by performing an etching treatment on said semiconductor substrate using said mask pattern as a mask;

a retreating step of performing an etching treatment so that a position of a side surface of said second film exposed on a side surface of said mask pattern will be retreated from a position of a side surface of said first film;

a thermal treatment step of forming an oxide film on a surface of said first film and said trench including the retreated side surface of said second film by performing a thermal treatment; and forming a buried dielectric film on said oxide film so as to fill said trench, wherein, in said retreating step, the side surface of said second film is retreated in advance so that the oxide film that has grown on the side surface of said second film may not be hung over the oxide film that has grown on the side surface of said first film after said thermal treatment step is performed.

2. The method of producing a semiconductor device according to claim 1, wherein said second film is retreated by dry etching in said retreating step.

3. The method of producing a semiconductor device according to claim 2, wherein said retreating step is performed before the step of forming the trench.

4. The method of producing a semiconductor device according to claim 3, wherein said first film comprises a silicon oxide film, said second film comprises a polysilicon film, and said layer serving as a mask material comprises a silicon nitride film.

5. The method of producing a semiconductor device according to claim 1, wherein said second film is retreated by wet etching in said retreating step.

6. The method of producing a semiconductor device according to claim 5, wherein said retreating step is performed before the step of forming the trench.

7. The method of producing a semiconductor device according to claim 6, wherein said first film comprises a silicon oxide film, said second film comprises a polysilicon film, and said layer serving as a mask material comprises a silicon nitride film.

8. The method of producing a semiconductor device according to claim 1, wherein said retreating step is performed before the step of forming the trench.

9. The method of producing a semiconductor device according to claim 8, wherein said first film comprises a silicon oxide film, said second film comprises a polysilicon film, and said layer serving as a mask material comprises a silicon nitride film.

10. The method of producing a semiconductor device according to claim 1, wherein said first film comprises a silicon oxide film, said second film comprises a polysilicon film, and said layer serving as a mask material comprises a silicon nitride film.

* * * * *

UNITED STATES PATENT AND TRADEMARK OFFICE
CERTIFICATE OF CORRECTION

PATENT NO. : 6,716,718 B2
DATED : April 6, 2004
INVENTOR(S) : Hiroyuki Nagatani et al.

It is certified that error appears in the above-identified patent and that said Letters Patent is hereby corrected as shown below:

Title page,
Item [73], Assignee, change "Mitsubishi Denki Kabushiki Kaisha" to -- Renesas Technology, Corp. --.

Signed and Sealed this

Fifth Day of April, 2005

JON W. DUDAS
*Director of the United States Patent and Trademark Office*